(12) United States Patent
Cheng et al.

(10) Patent No.: US 8,354,330 B2
(45) Date of Patent: Jan. 15, 2013

(54) METHOD OF FABRICATING SOI SUPER-JUNCTION LDMOS STRUCTURE CAPABLE OF COMPLETELY ELIMINATING SUBSTRATE-ASSISTED DEPLETION EFFECTS

(75) Inventors: Xinhong Cheng, Shanghai (CN); Dawei He, Shanghai (CN); Zhongjian Wang, Shanghai (CN); Dawei Xu, Shanghai (CN); Chao Xia, Shanghai (CN); Zhaorui Song, Shanghai (CN); Yuehui Yu, Shanghai (CN)

(73) Assignee: Shanghai Institute of Microsystem and Information Technology, Chinese Academy of Sciences, Changning District, Shanghai (CN)

( * ) Notice: Subject to any disclaimer, the term of this patent is extended or adjusted under 35 U.S.C. 154(b) by 0 days.

(21) Appl. No.: 13/203,724

(22) PCT Filed: Dec. 15, 2010

(86) PCT No.: PCT/CN2010/079822
§ 371 (c)(1),
(2), (4) Date: Aug. 27, 2011

(87) PCT Pub. No.: WO2012/009927
PCT Pub. Date: Jan. 26, 2012

(65) Prior Publication Data
US 2012/0058608 A1    Mar. 8, 2012

(30) Foreign Application Priority Data

Jul. 20, 2010  (CN) .......................... 2010 1 0231665

(51) Int. Cl.
*H01L 21/30* (2006.01)
*H01L 21/46* (2006.01)

(52) U.S. Cl. . 438/459; 438/406; 438/455; 257/E21.568; 257/E21.088

(58) Field of Classification Search .................. 438/406, 438/455, 459; 257/E21.568, E21.088
See application file for complete search history.

(56) References Cited

FOREIGN PATENT DOCUMENTS
WO  PCT/CN2010/079822    4/2011

*Primary Examiner* — Leonard Chang
(74) *Attorney, Agent, or Firm* — Global IP Services; Tianhua Gu

(57) ABSTRACT

The present invention relates to a method of fabricating an SOI SJ LDMOS structure that can completely eliminate the substrate-assisted depletion effects, comprising the following steps: step one: a conducting layer is prepared below the SOI BOX layer using the bonding technique; the conducting layer is prepared in the following way: depositing a barrier layer on a first bulk silicon wafer, and then depositing a charge conducting layer, thereby obtaining a first intermediate structure; forming a silicon dioxide layer on a second bulk silicon wafer via thermal oxidation, then depositing a barrier layer, and finally depositing a charge conducting layer, thereby obtaining a second intermediate structure; bonding the first intermediate structure and the second intermediate structure using the metal bonding technology to arrange the conducting layer below the SOI BOX layer; step two: a SJ LDMOS structure is fabricated on the SOI substrate having a conducting layer. The present invention is capable of releasing the charge accumulated at the lower interface of the BOX layer, eliminating the effect of the vertical charge on the charge balance between the p-type pillar and the n-type pillar, and therefore completely eliminating the substrate-assisted depletion effects and elevating the breakdown voltage of the device.

8 Claims, 2 Drawing Sheets

METHOD OF FABRICATING SOI SUPER-JUNCTION LDMOS STRUCTURE CAPABLE OF COMPLETELY ELIMINATING SUBSTRATE-ASSISTED DEPLETION EFFECTS

CROSS REFERENCE TO RELATED PATENT APPLICATION

The present application is the U.S. national stage of PCT/CN2010/079822 filed on Dec. 15, 2010, which claims the priority of the Chinese patent application No. 201010231665.5 filed on Jul. 20, 2010, which application is incorporated herein by reference.

FIELD OF THE INVENTION

The present invention relates to the microelectronics field, and particularly to an SOI super-junction LDMOS structure that can completely eliminate substrate-assisted depletion effects.

BACKGROUND OF THE INVENTION

Lateral double-diffused MOSFET (abbreviated as LDMOS) is a crucial technology to high voltage integrated circuits and power integrated circuits, wherein MOSFET stands for metal oxide semiconductor field effect transistor. LDMOS is characterized in that between a trench region and a drain region is arranged a relatively long lightly-doped drift region which is doped in the same way as the drain region. Arranging the drift region may increase a breakdown voltage thereof.

A super-junction LDMOS (abbreviated as SJ LDMOS) is an improved LDMOS, in which a group of n-type pillars and p-type pillars arranged in an alternate manner replace a lightly-doped n-type drift region of a traditional LDMOS. Theoretically, with the charge compensation between p-type pillar and n-type pillar, SJ LDMOS may have a high breakdown voltage, and meanwhile the heavily-doped n-type pillars may have a very low on-resistance. Therefore, super-junction devices may achieve a good balance between the breakdown voltage and the on-resistance. However, the substrate-assisted depletion effects result in a decrease in the breakdown voltage of the SJ LDMOS device.

The substrate-assisted depletion effects refer to that lateral super junctions are affected by a vertical electric field such that the symmetrical p-type pillars and n-type pillars in the super junctions may not be completely depleted at the same time, that is to say, the charge balance between the p-type pillar and the n-type pillar is destroyed. For a silicon-on-insulator (SOI) substrate in off-state, the back-gate effect of the substrate motivates non-uniformly distributed charges to accumulate at the interface between the buried oxide layer and the bottom silicon film by the action of the vertical field, enlarging the charge difference between the p-type pillar and the n-type pillar. This thereby results in that the p-type pillars and the n-type pillars fail to be completely depleted at the same time at a theoretically-calculated breakdown voltage.

There are generally two solutions to eliminate the substrate-assisted depletion effects of the SJ LDMOS.

One solution is to use a complete insulation substrate such as a sapphire substrate. As another example, a substrate obtained by etching a SOI substrate and filling epoxy resin into the thus-etched vacant cavity may be used. This solution may enable the substrate-assisted depletion effects to be completely eliminated, but its process is complicated and inordinately thin silicon increases on-resistance of devices.

Another solution is to prepare the SJ LDMOS on a common substrate (such as bulk silicon or SOI), and the charge balance between the pillars is achieved by, for example, designing the super junctions to be conical, controlling a width of the column, blending a SJ structure and a reduced surface field (RESURF) structure, or introducing a buffer layer. However, this solution is unfavorable for its failure to control distribution of impurities in the pillars and to realize the charge balance at the entire drift region.

SUMMARY OF THE INVENTION

The technical problem to be solved by the present invention is to provide a method of fabricating a SOI SJ LDMOS structure capable of completely eliminating the substrate-assisted depletion effects.

To achieve the above objective, the present invention provides a method of fabricating a SOI SJ LDMOS structure capable of completely eliminating the substrate-assisted depletion effects, the method including the following steps:

(1) a conductive layer is prepared below a buried oxide layer of a SOI structure using a bonding technique, the conductive layer being prepared by a1) acquiring a first intermediate structure by depositing a barrier layer and then a charge conducting layer on a first bulk silicon wafer, the charge conducting layer being half as thick as the conductive layer, a2) acquiring a second intermediate structure by forming a silicon dioxide layer on a second bulk silicon wafer by thermal oxidation and depositing a barrier layer and a charge conducting layer, the charge conducting layer being half as thick as the conductive layer, a3) bonding the first intermediate structure and the second intermediate structure by a metallic bonding technique to obtain the conductive layer below the buried oxide layer of the SOI structure, a4) decreasing a size of the second bulk silicon wafer at its back by hydrogen ion-implantation smart-cut technology to be as thin as a top silicon film of the SOI structure, and a5) leading out the conductive layer; and (2) a SJ LDMOS structure is fabricated on the SOI structure having the conductive layer.

In a preferred technical solution of the present invention, the charge conducting layer is a metallic conduction layer which has the melting point above 1000° C. and hardly diffuses at 900° C.

In another preferred technical solution of the present invention, the charge conducting layer is a highly conducting non-metallic layer.

In still another preferred technical solution of the present invention, the charge conducting layer is made of copper, and the barrier layer is made of tantalum nitride.

In still another preferred technical solution of the present invention, a thickness of the barrier layer is in a range from 70 angstroms to 80 angstroms.

In still another preferred technical solution of the present invention, the SJ LDMOS structure is fabricated by:

b1) performing trench isolation at an active region using shallow trench isolation technology;

b2) forming a gate oxide layer by thermal oxidation;

b3) forming a p-type region at the active region by a multiple ion-implantation process;

b4) forming a gate region by depositing polycrystalline silicon on the gate oxide layer and then doping and photo-etching the polycrystalline silicon;

b5) forming a body contact region, a source region, a drain region, and a drift region by an ion implantation process;

b6) growing silicon dioxide by low temperature oxidation technology over the entire active region;

b7) obtaining a silicon dioxide window by a wet etching process until silicon is exposed;

b8) depositing and then photoetching a metal to lead out a gate electrode, a source electrode, a drain electrode, and a conductive electrode; and b9) depositing silicon nitride to form a passivation layer.

In another preferred technical solution of the present invention, ion implantation is performed for multiple times in the drift region so as to form the n-type pillar and the p-type pillar which are arranged in an alternate manner.

The present invention is advantageous in enabling the charges accumulated at the lower interface of the buried oxide layer to be released by introducing a conductive layer below the SOI buried oxide layer. This prevents the charge balance between the p-type pillar and the n-type pillar from being influenced by the vertical electric field, therefore completely eliminating the substrate-assisted depletion effects and increasing the breakdown voltage of devices.

BRIEF DESCRIPTION OF THE DRAWINGS

Other and further objects, features, and advantages of the invention will be more explicit from the following detailed description taken with reference to the drawings wherein.

DETAILED DESCRIPTION OF THE EMBODIMENTS

Figure 1:
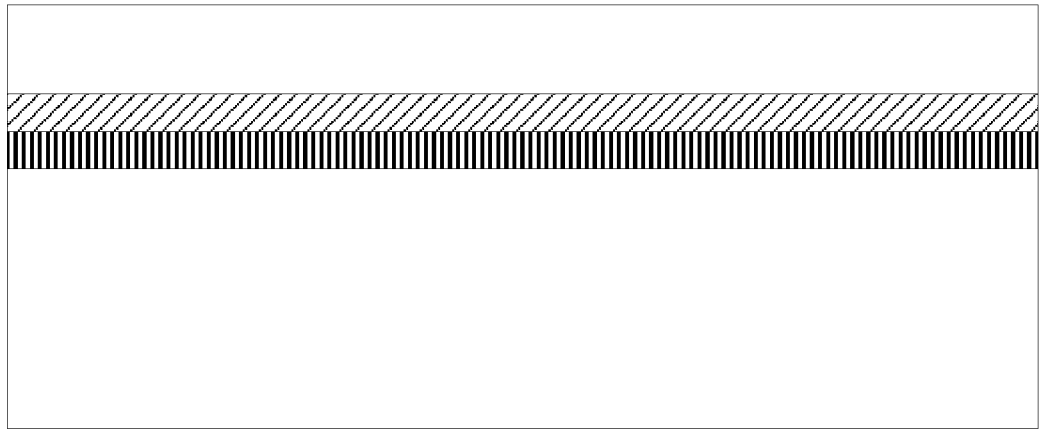
FIG. 1 is a schematic view showing a structure of a SOI substrate in which a conductive layer is arranged below a buried oxide layer.

Now referring to the drawings, preferred embodiments of the invention are described below.

Embodiment 1

Figure 2:
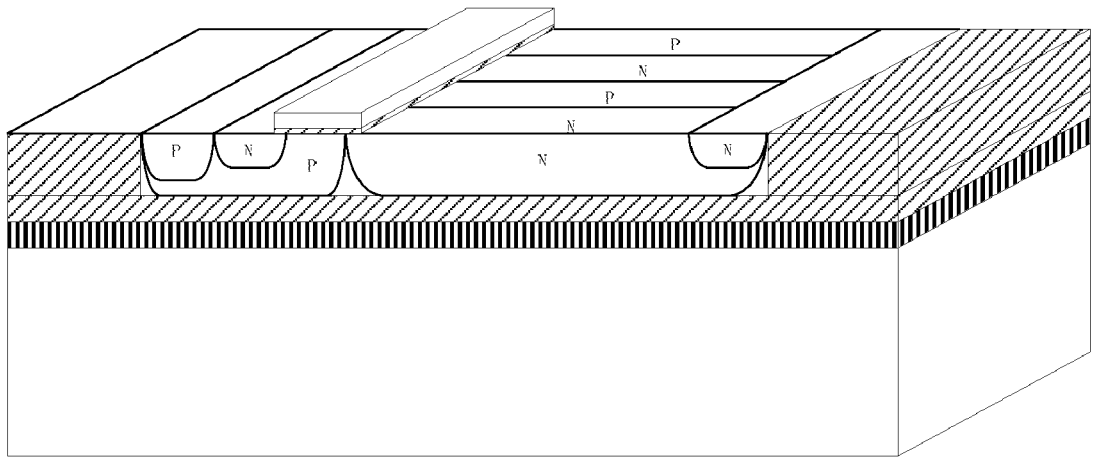
FIG. 2 is a schematic view partially showing a SOI SJ LDMOS structure according to the present invention.
Figure 3:
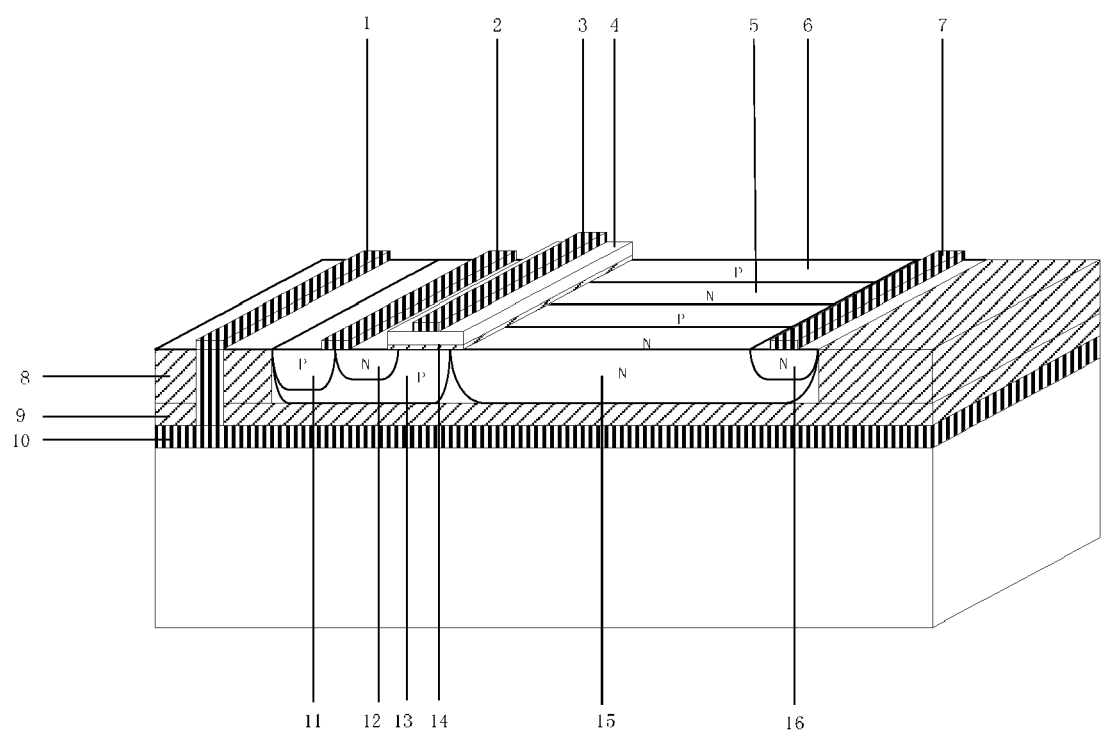
FIG. 3 is a schematic view showing the SOI SJ LDMOS structure according to the present invention.

This embodiment provides a silicon-on-insulator super-junction lateral double-diffused MOSFET (abbreviated as SOI SJ LDMOS) structure. As shown in FIGS. 1 to 3, the structure includes a silicon film, a conductive layer 10, a buried oxide layer 9, an active region, a trench isolation structure 8 and an electrode. The silicon film is located at the bottom of the SOI SJ LDMOS structure. The conductive layer 10 including a charge conducting layer and a barrier layer is located on an upper surface of the silicon film, wherein the barrier layer is grown on both an upper surface and a lower surface of the charge conducting layer. The buried oxide layer 9 is located on an upper surface of the conductive layer 10, and the active region includes a source region 12, a trench region 13, a drain region 16, a drift region 15, a gate region 4 which is located on an upper surface of the trench region 13, and a gate oxide layer 14 which is located between the gate region 4 and the trench region 13. Furthermore, the drift region 15 includes an n-type pillar and a p-type pillar which are arranged in an alternate manner. The trench isolation structure 8 surrounds the active region, and the electrode includes a source electrode 2 led out of the source region 12, a gate electrode 3 led out of the gate region 4, a drain electrode 7 led out of the drain region 16, and a conductive electrode 1 led out of the conductive layer 10.

The charge conducting layer is a metallic conduction layer that has a melting point above 1000° C. and hardly diffuses at 900° C., or is a highly conducting non-metallic layer. The charge conducting layer is made of copper and the barrier layer having a thickness of 70 angstroms to 80 angstroms is made of tantalum nitride. Different barrier layers may be selected in accordance with different metals. In the present invention, arranging the conductive layer below the SOI buried oxide layer enables charges accumulated at a lower interface of the buried oxide layer to be released, thus preventing charge balance between the p-type pillar and the n-type pillar from being influenced by a vertical electric field. This results in a complete elimination of substrate-assisted depletion effects and an increase in breakdown voltage of devices.

Embodiment 2

This embodiment provides a method of fabricating a SOI super-junction LDMOS structure capable of completely eliminating the substrate-assisted depletion effects, and the method includes the following steps.

(1) Firstly, a conductive layer is prepared below a buried oxygen layer of a SOI structure using the bonding technique by:

a) depositing a tantalum nitride barrier layer (about 75 angstroms) on a first bulk silicon wafer, and then depositing a copper layer which is half as thick as a metallic conduction layer to be grown;

b) forming a silicon dioxide layer on a second bulk silicon wafer by thermal oxidation, and then depositing a tantalum nitride barrier layer (about 75 angstroms) and a copper layer which is half as thick as the metallic conduction layer to be grown;

c) bonding the first bulk silicon wafer and the second bulk silicon wafer using the metallic bonding technique; and d) decreasing a size of the second bulk silicon wafer at its back using hydrogen ion-implantation smart-cut technology to be as thin as the top silicon film of the SOI structure.

(2) Trench isolation is performed at the active region using shallow trench isolation (abbreviated as STI) technology.

(3) A gate oxide layer is formed by thermal oxidation.

(4) A p-type region is formed by a multiple ion-implantation process.

(5) Polycrystalline silicon is deposited, doped, and photo-etched so as to form a gate region.

(6) An n-type pillar and a p-type pillar which are arranged in an alternate manner are formed in sequence by the multiple ion-implantation process.

(7) A body contact region, a source region, and a drain region are formed in sequence by an ion implantation process.

(8) Silicon dioxide is grown by low temperature oxidation technology over the entire active region.

(9) A silicon dioxide window is created by a wet etching process until silicon is exposed.

(10) A metal is deposited and photoetched to lead out a gate electrode, a source electrode, a drain electrode, and a conductive electrode.

(11) And finally, silicon nitride is deposited to form a passivation layer.

The above description of the detailed embodiments is only to illustrate the preferred implementation according to the preset invention, and it is not to limit the scope of the present invention. Accordingly, all modifications and variations completed by those with ordinary skills in the art should fall within the scope of the present invention defined by the appended claims.

What is claimed is:

1. A method of fabricating a SOI SJ LDMOS structure that can completely eliminate substrate-assisted depletion effects, the method comprising the following steps:
(1) a conductive layer is prepared below a buried oxide layer of a SOI structure using a bonding technique, the conductive layer being prepared by;
a1) acquiring a first intermediate structure by depositing a barrier layer on a first bulk silicon wafer, then depositing a charge conducting layer on the barrier layer;
a2) acquiring a second intermediate structure by forming a silicon dioxide layer on a second bulk silicon wafer by thermal oxidation, depositing a barrier layer on the silicon dioxide layer and depositing a charge conducting layer on the barrier layer;
a3) bonding the first intermediate structure and the second intermediate structure by a metallic bonding technique to obtain the conductive layer below the buried oxide layer of the SOI structure;
a4) decreasing a size of the second bulk silicon wafer at its back by hydrogen ion-implantation smart-cut technology to be as thin as a top silicon film of the SOI structure; and
a5) leading out the conductive layer; and
(2) a SJ LDMOS structure is fabricated on the SOI structure having the conductive layer.

2. The method of fabricating the SOI SJ LDMOS structure according to claim 1, wherein the charge conducting layer in step a1) and the charge conducting layer in step a2) are both half a desired thickness.

3. The method of fabricating the SOI SJ LDMOS structure according to claim 1, wherein the charge conducting layers in steps a1) and a2) are metallic conduction layers that have a melting point above 1000° C. and hardly diffuses at 900° C.

4. The method of fabricating the SOI SJ LDMOS structure according to claim 1, wherein the charge conduction layers in steps a1) and a2) are highly conducting non-metallic layers.

5. The method of fabricating the SOI SJ LDMOS structure according to claim 1, wherein the charge conducting layers in steps a1) and a2) are made of copper and the barrier layers in steps a1) and a2) are made of tantalum nitride.

6. The method of fabricating the SOI SJ LDMOS structure according to claim 1, wherein a thickness of the barrier layers in steps a1) and a2) are in a range from 70 angstroms to 80 angstroms.

7. The method of fabricating the SOI SJ LDMOS structure according to claim 1, wherein the SJ LDMOS structure is fabricated by:
b1) performing trench isolation at an active region using shallow trench isolation technology;
b2) forming a gate oxide layer by thermal oxidation;
b3) forming a p-type region at the active region by a multiple ion-implantation process;
b4) forming a gate region by depositing polycrystalline silicon on the gate oxide layer and then doping and photoetching the polycrystalline silicon;
b5) forming a body contact region, a source region, a drain region, and a drift region by an ion implantation process;
b6) growing silicon dioxide by low temperature oxidation technology over the entire active region;
b7) obtaining a silicon dioxide window by a wet etching process until silicon is exposed;
b8) depositing and then photoetching a metal to lead out a gate electrode, a source electrode, a drain electrode, and a conductive electrode; and
b9) depositing silicon nitride to form a passivation layer.

8. The method of fabricating the SOI SJ LDMOS structure according to claim 7, wherein the ion implantation is performed for multiple times in the drift region to form an n-type pillar and a p-type pillar arranged in an alternate manner.

* * * * *